United States Patent
Chen et al.

(10) Patent No.: US 7,253,098 B2
(45) Date of Patent: Aug. 7, 2007

(54) MAINTAINING UNIFORM CMP HARD MASK THICKNESS

(75) Inventors: Shyng-Tsong T. Chen, Patterson, NY (US); Kaushik Arun Kumar, Beacon, NY (US); Stephen Edward Greco, LaGrangeville, NY (US); Shom Ponoth, Fishkill, NY (US); Terry Allen Spooner, New Fairfield, CT (US); David L. Rath, Stormville, NY (US); Wei-Tsu Tseng, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,145

(22) Filed: Aug. 27, 2004

(65) Prior Publication Data

US 2006/0043590 A1   Mar. 2, 2006

(51) Int. Cl.
*H01L 21/4763* (2006.01)

(52) U.S. Cl. ............... 438/637; 438/692; 257/E21.577

(58) Field of Classification Search ........ 438/618–627, 438/629, 631, 636, 637, 639, 643, 675, 687, 438/691–693, 653, 672; 257/E21.277, E21.575, 257/E21.577, E21.581

See application file for complete search history.

(56) References Cited

U.S. PATENT DOCUMENTS

| | | | |
|---|---|---|---|
| 6,221,775 B1 * | 4/2001 | Ference et al. ............. 438/691 |
| 6,358,839 B1 | 3/2002 | Li et al. | |
| 6,479,391 B2 * | 11/2002 | Morrow et al. ............. 438/706 |
| 6,486,082 B1 * | 11/2002 | Cho et al. .................. 438/789 |
| 6,660,627 B2 * | 12/2003 | Hu et al. .................... 438/624 |
| 6,872,666 B2 * | 3/2005 | Morrow ..................... 438/700 |
| 2002/0074659 A1 * | 6/2002 | Dalton et al. .............. 257/758 |
| 2002/0182853 A1 * | 12/2002 | Chen et al. ................ 438/637 |

OTHER PUBLICATIONS

L.P. Allen et al., Substrate Smoothing Using Gas Cluster Ion Beam Processing, 2001, Journal of Electronic Materials, vol. 30, No. 7, (Abstract only).*

* cited by examiner

*Primary Examiner*—Brook Kebede
(74) *Attorney, Agent, or Firm*—Howard M. Cohn, Esq.; H. Daniel Schnurmann

(57) ABSTRACT

A chemical mechanical polishing (CMP) step is used to remove excess conductive material (e.g., Cu) overlying a low-k or ultralow-k interlevel dielectric layer (ILD) layer having trenches filled with conductive material, for a damascene interconnect structure. A reactive ion etch (RIE) or a Gas Cluster Ion Beam (GCIB) process is used to remove a portion of a liner which is atop a hard mask. A wet etch step is used to remove an oxide portion of the hard mask overlying the ILD, followed by a final touch-up Cu CMP (CMP) step which chops the protruding Cu patterns off and lands on the SiCOH hard mask. In this manner, processes used to remove excess conductive material substantially do not affect the portion of the hard mask overlying the interlevel dielectric layer.

7 Claims, 2 Drawing Sheets

MAINTAINING UNIFORM CMP HARD MASK THICKNESS

BACKGROUND OF INVENTION

The invention relates to the fabrication of integrated circuit (IC) devices, particularly to dielectric materials, and more particularly to the fabrication of an interconnect structure which includes a low-k or ultralow-k interlevel dielectric layer (ILD).

Semiconductor devices are typically joined together to form useful circuits using interconnect structures comprising conductive materials (e.g., metal lines) such as copper (Cu) or aluminum (Al) and dielectric materials such as silicon dioxide ($SiO_2$). The speed of these interconnects can be roughly assumed to be inversely proportional to the product of the line resistance (R), and the capacitance (C) between lines. To reduce the delay and increase the speed, it is desirable to reduce the capacitance (C). This can be done by reducing the dielectric constant, k, of the dielectric material in the interlevel dielectric layers (ILDs).

A common dielectric material for use in an interlevel dielectric layer (ILD) is silicon dioxide ($SiO_2$), also referred to simply as "oxide"). Oxide has a dielectric constant k of at least 3.85 typically 4.1-4.3, or higher. Air has a dielectric constant k of approximately 1.0. By definition, a vacuum (free space) has a dielectric constant k of 1.0.

"Low-k" dielectric materials are known, and are typically defined as materials having a dielectric constant k less than 3.85—in other words, less than that of oxide.

A variety of "low-k" materials are known, such as SiLK™, an organic polymer with k=2.65 sold by Dow Chemical., and Black Diamond™, a organosilicon glass with a dielectric constant, k, of 2.7 to 3.0, sold by Applied Materials.

Dielectric materials can also be categorized by how they are applied (deposited) on the surface of a semiconductor wafer—for example, by a vapor deposition process or by a spin-on deposition process. Chemical Vapor Deposition (CVD) is used to deposit both dielectric and conductive films via a chemical reaction that occurs between various gases in a reaction chamber. Plasma enhanced Chemical Vapor Deposition (PECVD) uses an inductively coupled plasma to generate different ionic and atomic species during the deposition process. PECVD typically results in a low temperature deposition compared to the corresponding thermal CVD process. Spin-on processes are used to deposit materials such as photoresist, and can also be used to deposit dielectric materials. A wafer is coated with material in liquid form, then spun at speeds up to 6000 rpm, during which the liquid is uniformly distributed on the surface by centrifugal forces, followed by a low temperature bake which solidifies the material.

Examples of CVD and PECVD low-k materials include:
Black Diamond™, a organosilicon glass (OSG) which is a Si—O—C—H type of material, with a dielectric constant k of 2.7 to 3.0 (e.g., 2.9), sold by Applied Materials Inc.
CORAL™, also an organosilicon glass (OSG) which is a Si—O—C—H type of material, with k of 2.7-3.0, sold by Novellus Systems, Inc.
fluorinated $SiO_2$ glass, and amorphous C:F.
porous-Organo-silicate materials that is offered by a variety of vendors.
Examples of spin-on low-k materials include:
BCB (divinylsiloxane bisbenzocyclobutene), sold by Dow Chemical.
SiLK™, an organic polymer with k=2.65, similar to BCB, sold by Dow Chemical.
NANOGLASS™, an inorganic porous polymer with k=2.2, sold by Honeywell
FLARE 2.0™ dielectric, an organic low-k poly(arylene) ether available from Allied Signal, Advanced Microelectronic Materials, Sunnyvale, Calif.
Inorganic materials such as spin-on glass (SOG), fluorinated silicon glass (FSG) and, particularly, methyl-doped porous silica which is referred to by practitioners of the art as black diamond, or BD.
Organo-silicate materials, such as JSR LKD 5109 (a spin-on material, Japan Synthetic Rubber)—Organic polymers (fluorinated or non-fluorinated), inorganic polymers (nonporous), inorganic-organic hybrids, or porous materials (xerogels or aerogels).
Materials in the parylene family of polymers, the polynapthalene family of polymers, or polytetrafluoroethylene.

It is known that pores in dielectric materials can lower the dielectric constant. Low-k dielectric materials can typically be deposited ab initio either with or without pores, depending on process conditions. Since air has a dielectric constant of nearly 1, porous films exhibit reduced dielectric constants in contrast with the base material in which they are developed.

The use of low-k materials, with or without pores, is well known for use as Interlevel Dielectric Layer (ILD). Sometimes, materials having k<2.7 are referred to as "ultralow-k".

Damascene, particularly dual damascene interconnect structures have received widespread application in recent years. They allow for high aspect ratio (i.e., tall, yet thin) conductive lines, hence greater interconnect densities. Generally, a dual damascene structure comprises a via etched through a first dielectric layer and a trench etched through a second, overlying dielectric layer, over-filling the via and trench with metal (usually copper) and then planarizing the resulting interconnect structure with chemical mechanical polishing (CMP). Before depositing copper, various other layers are deposited (e.g., barrier, liner, copper seed, plate). An example of a dual damascene structure is illustrated in U.S. Pat. No. 6,358,839.

Chemical Mechanical Polishing (CMP) is a key technology in the manufacture of high-density electronic circuits. The process uses advanced polishing techniques involving slurries—mixture of high-performance abrasives and chemicals. CMP is very important in the process for manufacturing a semiconductor device, for instance, shallow trench isolation (STI), planarization of interlayer dielectric (ILD), formation of embedded metal line, plug formation, formation of embedded capacitor, and the like. CMP involves rotating a wafer against a polishing pad under pressure in the presence of a slurry. Since the process of CMP is very well known in the art, including its essential components, it need not be discussed in much detail herein.

A problem with porous ultra-low-k materials, is that they are generally not compatible with CMP. Because of their porous nature these materials are innately soft, when compared to their bulk (non-porous) counterparts, which can give rise to problems during semiconductor processing, particularly during planarization by CMP.

For any dielectric materials—i.e., low-k and ultralow-k materials—that are inherently not compatible with CMP, it is known to provide a hard mask (HM) over the dielectric material to avoid polishing the dielectric material (act as a polish stop). Examples of hard mask materials are silicon carbides such as SiC, SiCN, SiCNH, SiCOH, SiCO, or SiCH. Often, the hard mask comprises an additional, overlying sacrificial layer of oxide which also forms part of the overall hard mask.

In a typical damascene process, when excess metal (i.e., metal overfilling the trench, typically copper (Cu)) is removed by CMP the lower HM remains in place, but will have been thinned by CMP, in some areas more than others, due to non-uniform pattern densities across the wafer. Some typical CMP slurries for performing Cu CMP are:

Abrasive (alumina, silica), plus
oxidizer (hydrogen peroxide, ferric nitrate), plus
additives (BTA, surfactants).

A typical polish selectivity (ratio) for Cu CMP between the copper and the hard mask would be:Cu polish rate: SiCOH HM polish rate ~25:1.

The ultralow K dielectric material for high performance interconnect structure usually requires a CMP hard mask on top of it to protect it from damage caused by CMP process. (The hard mask may also be important for sealing porous dielectric materials.) It is important that the CMP hard mask be retained uniformly after CMP process. This is usually a problem because of the pattern (of copper lines) density is not uniform on the chip.

SUMMARY OF INVENTION

It is therefore an aspect of the invention to provide an improved technique for forming an interconnect structure, particularly a damascene interconnect structure, which incorporates a low-k or ultra low-k dielectric.

According to the invention, generally, a reactive ion etch (RIE) or a Gas Cluster Ion Beam (GCIB) etch or chemical mechanical polishing (CMP) is used to remove the liner layer after Cu CMP of the copper overfilling a damascene trench. Then a wet process is used to remove the first oxide HM layer, leaving a uniform CMP hard mask. Finally a Cu CMP touch up process is used to polish away the Cu line above the SiCOH hard mask surface.

According to the invention, a method of forming an interconnect structure comprise the steps of: depositing a dielectric layer; forming a hard mask over the dielectric material; etching trenches in the dielectric material; depositing a liner material over the hard mask and within the trenches; and overfilling the trenches with a conductive material; and is characterized by: performing a first chemical mechanical polishing (CMP-1) process to remove conductive material which is atop the liner, thereby exposing the liner; removing that portion of the liner which is atop the hard mask; removing a first portion of the hard mask using a wet etch process, thereby leaving in place a second portion of the hard mask; and performing touch-up chemical mechanical polishing (CMP-3) process to remove conductive material and liner material protruding from the trenches.

According to further aspects of the invention, the dielectric material may comprise a low-k material or an ultralow-k material. The hard mask may comprise a layer of silicon carbide or similar materials atop the dielectric layer; and a layer of oxide atop the layer of silicon carbide. The conductive material may be copper. The portion of the liner which is atop the hard mask may be removed by a reactive ion etch (RIE) or a Gas Cluster Ion Beam (GCIB) process.

According to the invention, a method of forming an interconnect structure comprises the steps of: depositing a dielectric material; forming a hard mask over the dielectric material; etching trenches in the dielectric material; and overfilling the trenches with a conductive material; and is characterized by: performing a first chemical mechanical polishing step; then, performing a wet etch step: and then, performing a second chemical mechanical polishing step.

According to further aspects of the invention, at least a portion of the hard mask is left substantially intact, and the portion of the hard mask which is left substantially intact may comprise SiCOH. Prior to overfilling the trenches, a liner material may be deposited over the hard mask and within the trenches; and a portion of the liner which is atop the hard mask may be removed by a reactive ion etch (RIE) or a Gas Cluster Ion Beam (GCIB) process.

According to the invention, a semiconductor device includes at least one interconnect structure, and the interconnect structure comprises: an interlevel dielectric layer (ILD) layer having trenches filled with conductive material; and a hard mask overlying the interlevel dielectric layer (ILD); wherein at least a portion of the hard mask overlying the interlevel dielectric layer is substantially uniform in thickness and substantially planar irrespective of pattern density variations.

According to further aspects of the invention, the conductive material may be copper. The portion of the hard mask may comprise SiCOH. The trenches are first overfilled with conductive material; and processes used to remove excess conductive material substantially do not affect the portion of the hard mask overlying the interlevel dielectric layer.

A benefit of the present invention is that it maintains a uniform hard mask thickness. Compared with a conventional CMP approach (discussed hereinbelow) to remove oxide and SiCOH HM, in the present invention, the high oxide/SiCOH selectivity of the wet etch step and its insensitivity to pattern density effects ensure the complete removal of oxide without consuming the SiCOH underneath. The final touch-up Cu CMP chops protruding Cu patterns off and lands on the SiCOH hard mask with its extremely high Cu removal rate (>7 KÅ/min) and low SiCOH removal rate (<50 Å/min).

BRIEF DESCRIPTION OF DRAWINGS

The structure, operation, and advantages of the present invention will become further apparent upon consideration of the following description taken in conjunction with the accompanying figures (FIGS.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines that would otherwise be visible in a "true" cross-sectional view, for illustrative clarity.

DETAILED DESCRIPTION

Figure 1:
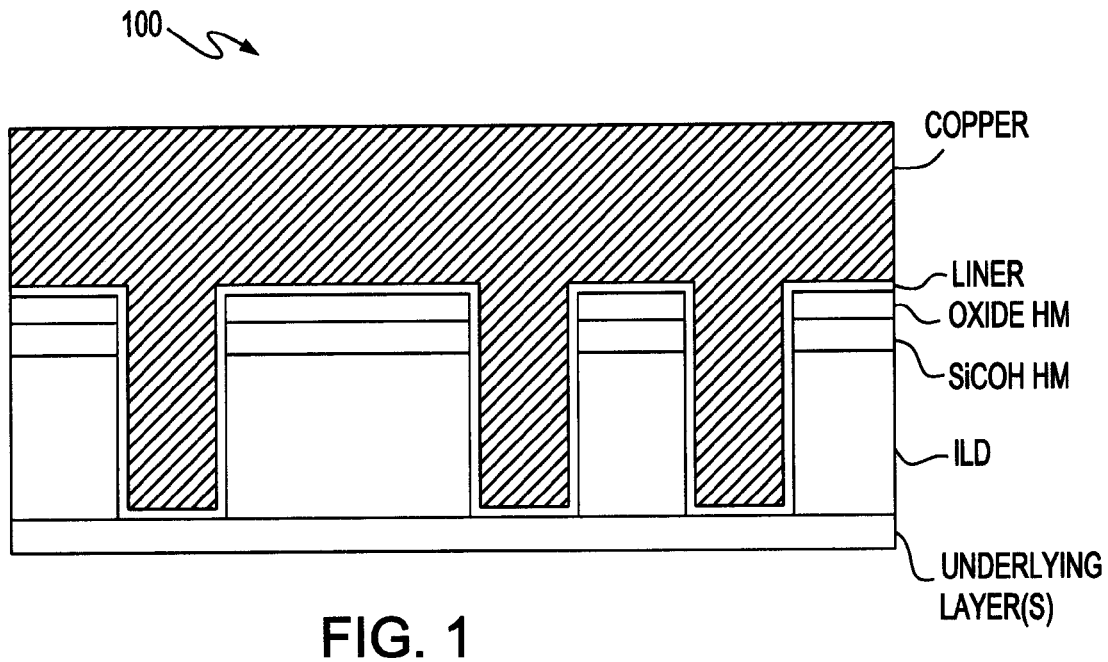
FIG. 1 is a cross-sectional view of a relevant portion of a semiconductor device—namely, an interlevel dielectric layer (ILD) which has been patterned and filled with copper (Cu)—illustrating a first step in a process of forming a useful interconnect structure, according to the invention.

In the description that follows, numerous details are set forth in order to provide a thorough understanding of the present invention. It will be appreciated by those skilled in the art that variations of these specific details are possible while still achieving the results of the present invention. Well-known elements and processing steps are generally not described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred simply as "oxide", chemical formula $SiO_2$.

In the description that follows, exemplary dimensions may be presented for an illustrative embodiment of the invention. The dimensions should generally not be interpreted as limiting. They are included to provide a sense of proportion. Generally speaking, it is the relationship between various elements, where they are located, their contrasting compositions, and sometimes their relative sizes that is of significance.

In the drawings accompanying the description that follows, often both reference numerals and legends (labels, text descriptions) may be used to identify elements. If legends are provided, they are intended merely as an aid to the reader, and should not in any way be interpreted as limiting.

Figure 2:
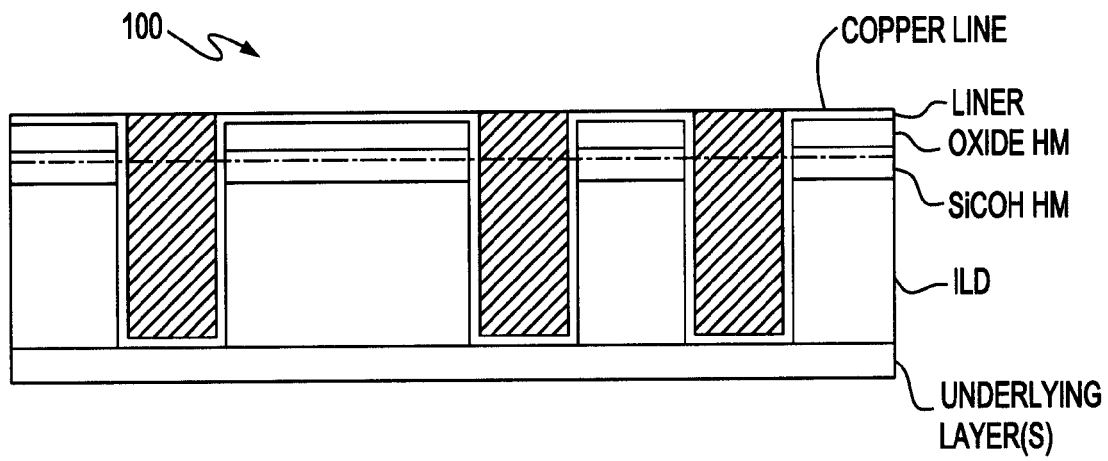
FIGS. 2-5 are cross-sectional views illustrating further steps in the process, according to the invention.
Figure 3:
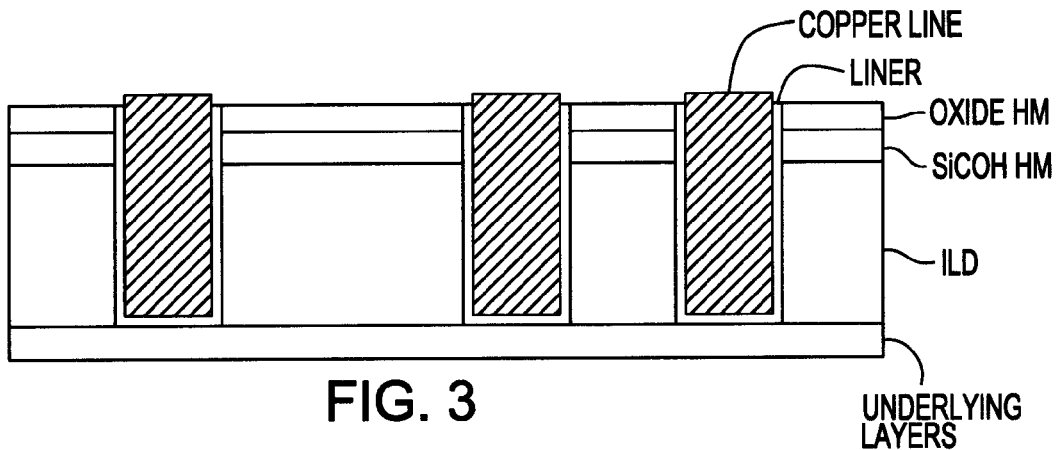
Figure 4:
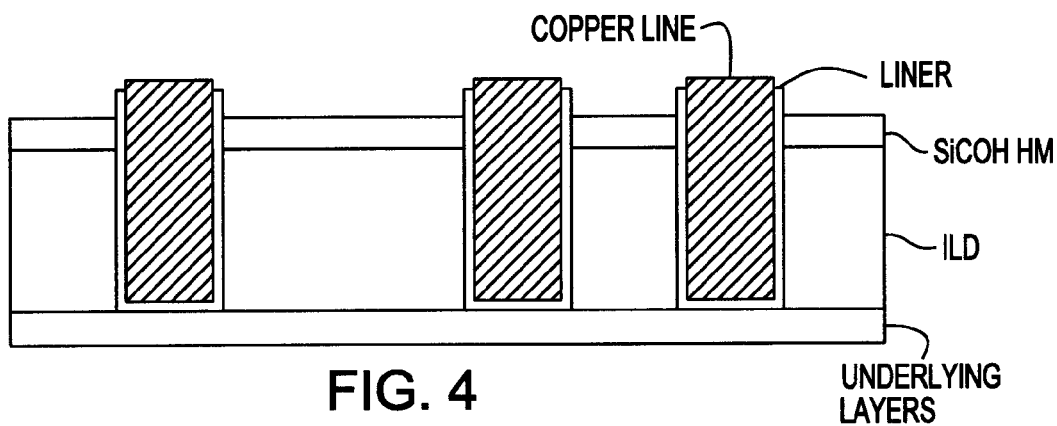
Figure 5:
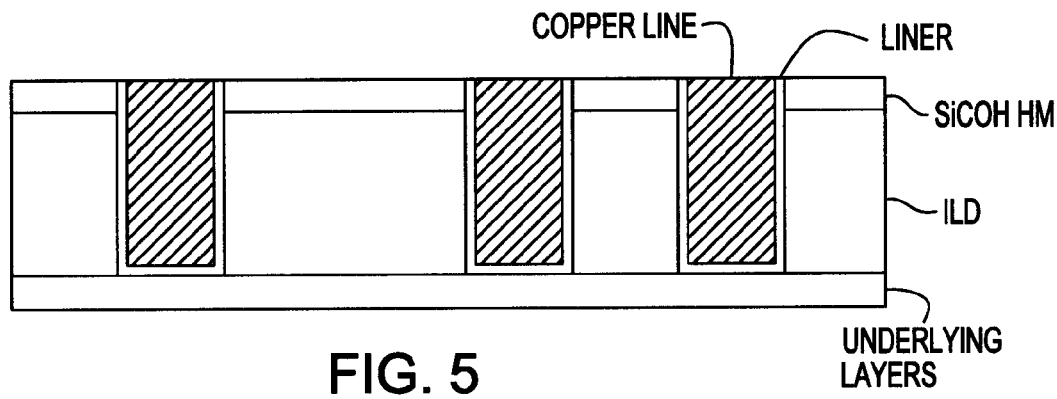

FIG. 1 is a cross-sectional view of a relevant portion of a semiconductor substrate 100—namely, an interconnect structure prior to CMP—formed according to the techniques of the present invention. The interconnect structure is generally a one of often several (M1, M2, . . . ) damascene wiring levels incorporated in a semiconductor device. In FIG. 1 the interconnect structure is shown at an early stage. In FIG. 5, the completed interconnect structure is shown. In FIGS. 2-4, iterim (in-process) structures are shown.

An interlevel dielectric layer (ILD) is formed (deposited) atop underlying layer(s) of the substrate. The underlying layer(s) may comprise a previous wiring layer, active devices, and the like. In this example, the ILD is a low-k or ultralow-k dielectric material such as SiCOH or porous-SiCOH, which is deposited by a chemical vapor deposition (CVD) process or spin-on deposition process. The ILD has a typical exemplary thickness (vertical in the figure) in the range of 200-20,000 Å (Angstroms), such as 500-15,000 Å.

A hard mask (HM) is formed (deposited) atop (overlies) the ILD. The hard mask serves various purposes. After it is patterned, it serves as a mask for etching trenches (or vias) in the ILD. It will also serve as an etch stop, later in the process. In the case of porous dielectric material, the hard mask serves as a moisture barrier to protect the dielectric.

The hard mask typically comprises two layers. The first layer (disposed atop the ILD) is referred to as "SiCOH HM" and is typically a silicon carbide SiC material (including SiC or SiCN or SiCH or SiCOH) deposited by chemical vapor deposition process or spin-on deposition process and having a typical exemplary thickness (vertical in the figure) in the range of 50-5000 Å, such as 100 Å to 1000 Å. The SiCOH HM possesses properties that enable it to function as a polish stop layer during subsequent copper chemical mechanical polishing (CMP).

The second layer (disposed atop the first layer) is referred to as "Oxide HM", and is typically simply silicon dioxide (oxide) material deposited by chemical vapor deposition and having a typical exemplary thickness (vertical in the figure) in the range of 50-5000 Å, such as 100 Å to 1000 Å.

The SiCOH HM and Oxide HM layers of the hard mask are patterned to have openings over areas of the ILD where it is desired to form trenches, using lithography and reactive ion etch (RIE) processes.

With the hard mask (HM) in place, the ILD is etched to have trenches (three trenches are shown in the figure) each of which extends completely through the ILD from the top surface thereof down to the Underlying Layer(s). The trenches are formed using reactive ion etch processes. The trenches have a typical exemplary width (horizontal in the figure) of 30 nm to 1000 nm. These trenches, or vias, are typically part of an overall damascene process being used to form the interconnect structure.

Next, a "liner" is formed (deposited). The liner covers the top surface of the hard mask, the sidewall surfaces of the trenches in the ILD, and portions of the surface of the Underlying Layer(s) which are exposed within (at the bottom of) the trenches of the ILD. The liner suitably comprises a conductive material such as tantalum (Ta), tantalum nitride (TaN), titanium (Ti), silicon nitride (SiN), titanium silicon nitride (TiSiN), ruthenium (Ru), tungsten nitride (WNx) or tungsten (W), and is suitably deposited using a sputtering process, or chemical vapor deposition process or atomic vapor deposition process. The liner deposits substantially uniformly on all the exposed surfaces, and has a typical exemplary thickness in the range of 5 Å to 500 Å.

Next, a damascene copper (Cu) is deposited, completey filling and overfilling the trenches. Thus, as illustrated in FIG. 1, there is copper everywhere atop the interconnect structure. The copper is deposited by electroplating, usually to a thickness in the range of 1000 Å to 20000 Å, and deposits substantially planar. The process of forming damascene copper interconnects in an ILD is well known, and many minor steps involved (e.g., barrier, copper seed, plate) are omitted, for illustrative clarity. It is within the scope of the invention that conductive materials other than copper may be employed in the interconnect structure, such as aluminum alloy. For purposes of this discussion, the conductive material is referred to simply as "copper".

The resulting interconnect structure (ILD with copper) is subjected to "copper" chemical mechanical polishing (Cu CMP). A typical copper removal rate for Cu CMP is >7 KÅ/min.

By way of further background, with reference to FIG. 2, in the prior art it is common practice to perform Cu CMP to remove the excess copper, to continue Cu CMP polishing down to the liner. The Cu CMP polish is usually designed to have low liner polish rates, hence effectively stopping on the liner. Once the Cu residuals are cleared, a liner polish step is initiated. The liner polish step which may employ a different consumable and/or tool, is usually designed to have reasonable liner polish rates and preferably low SiCOH and Cu polish rates. The liner polishing step polishes the liner material and continues through the Oxide HM, targeting stopping on the SiCOH HM. This will involve some polishing of the SiCOH HM, and is illustrated by the dashed line in FIG. 2. However, in practice, because of non-uniform pattern densities, the thinning of SiCOH HM does not proceed so uniformly. Rather, in some areas Cu CMP and the subsequent liner polishing inevitably proceeds further than in others. For example, three trenches are shown in FIG. 2 The left trench and the middle trench are illustrated relatively far apart, representing a relatively low pattern density. The middle trench and the right trench are illustrated relatively close together, representing a relatively high pattern density. In such a case, it is likely that polishing (material removal) will be lower in the low pattern density areas than in the high pattern density areas. This has various implications. First of all, planarity may not be maintained. Secondly, it will be evident from an examination of a completed interconnect structure that Cu CMP was employed, as the SiCOH HM will be noticeably thinner in some areas than in others. Also, this may also result in complete loss of SiCOH HM in some areas and possible gouging of the ILD, both of which are very undesirable. Thirdly, an uneven CMP process results in variation in the Cu line heights that causes fluctuation in the line resistance that is dependent on pattern density.

According to the invention, the process of removing excess copper proceeds differently than in the prior art, and results in an improved interconnect structure and an improves process for forming the interconnect structure.

According to the invention, Cu CMP is performed, using the same slurries, etc. that are used in the prior art, but proceeds only as far as the top surface of the liner—to the "copper line" shown in FIG. 2—leaving in place the liner (which may partially be polished), the Oxide HM (intact), and the SiCOH HM (intact). (Certainly, with the SiCOH HM being intact, this ensures that the ILD will also be intact.) The resulting interim (partially completed) interconnect structure is shown in FIG. 2. In this step, conductive material (copper) is removed, but only that which is atop the liner (i.e., until the liner becomes exposed).

A feature of the invention is ensuring that the oxide HM is thick enough such that the topographical variations after Cu CMP and liner removal are entirely within the oxide HM. As noted above, the Oxide HM has a typical exemplary thickness in the range of 50 5000 Å, such as 100 Å to 1000 Å.

In a next step, the portion of the liner which is over the hard mask is removed. (The portion of the liner which is within the trench is not affected in this, or in any other step.) This is done using either a reactive ion etch (RIE) or a Gas Cluster Ion Beam (GCIB) process. These processes are highly selective to the material of the liner (tantalum, etc.) over the Oxide HM. And, the copper remains substantially intact during this process. The resulting interim (partially completed) interconnect structure is shown in FIG. 3 wherein it can be observed that the copper from within the trenches protrudes slightly (e.g., substantially equal to the original thickness of the liner), above the level of the Oxide HM. (The "copper line" is slightly higher than the Oxide HM.)

The liner may also be removed by a short liner polish also. Again, it is important that the oxide HM is thick enough such that the topographical varations post liner CMP is all within the oxide HM.

Generally, the liner polish is not as selective as the other processes mentioned above. Typical liner polish rates are 200-600 Å/min. Typical Cu polish rates in liner slurry are 100-1000 Å/min.

Next, the Oxide HM is removed, using a suitable process such as hydrogen fluoride (HF) wet etch. The resulting interim (partially completed) interconnect structure is shown in FIG. 4. Again, it can be observed that the copper from within the trenches protrudes slightly (e.g., substantially equal to the original thickness of the liner, plus the original thickness of the Oxide HM), above the level of the SiCOH HM. Also, that the portion of the liner which was within the Oxide HM protrudes above the level of the SiCOH HM, because the wet etch leaves the liner material (and copper) substantially untouched. Importantly, in this step, the SiCOH HM is left in place, substantially intact. In other words, processes used to remove excess conductive material (e.g., Cu) substantially do not affect the portion of the hard mask (e.g., SiCOH HM) overlying the interlevel dielectric layer (ILD).

Finally, a CMP "touch up" process is performed to remove the conductive material (e.g., copper) and liner material protruding from the trenches. The resulting final (completed) interconnect structure is shown in FIG. 5. In this step, an abrasive-free or low-abrasive polish can be used. As the polish for such a slurry will be more chemical than mechanical a very high selectivity can be obtained, such as Cu polish rate ~2000 Å/min, SiCOH polish rate <60 Å/min. Although this step can be abrasive-free, it is nevertheless referred to herein as a "CMP" process.

Compared with conventional CMP approach to remove oxide and SiCOH HM, in the present invention, the high oxide/SiCOH selectivity of the wet etch step and its insensitivity to pattern density effects ensure the complete removal of oxide without consuming the SiCOH underneath. The final touch-up Cu CMP chops the protruding Cu patterns off and lands on the SiCOH hard mask with its extremely high Cu removal rate (>7 KÅ/min) and low SiCOH removal rate (<50 Å/min) In other words, whereas in the prior art process described hereinabove the SiCOH HM portion of the hard mask will be noticeably thinner in some areas than in others, when using the technique of the present invention the SiCOH HM portion of the hard mask will be left substantially intact, as deposited, hence substantially uniform in thickness and substantially planar irrespective of pattern density variations.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. Method of forming an interconnect structure comprising the steps of: depositing a dielectric layer of ultra low-k material; forming a hard mask over the dielectric layer, wherein the hard mask comprises: a layer of silicon carbide (SiC) material including (SiCOH) material overlying the dielectric layer; and a layer of oxide material overlying the silicon carbide material; etching trenches in the dielectric layer; depositing a liner over the hard mask and within the trenches; and overfilling the trenches with a conductive material; perfoming a chemical mechanical polishing process to remove the conductive material which is atop the liner, thereby exposing the liner; removing the portion of the liner which is atop the hard mask using a Gas Cluster Ion Beam (GCIB), leaving the conductive material protruding from the trenches; and removing the layer of oxide material using a wet etch process, leaving the layer of silicon carbide material, the conductive material and the liner material above the layer of silicon carbide material protruding from the trenches; and performing a touch-up polishing process to remove the conductive material and the liner protruding from the trenches.

2. The method of claim 1, wherein:
the layer of silicon carbide material has a thickness in the range of 1000-5000 Å,
the layer of oxide material has a thickness in the range of 1000-5000 Å.

3. The method of claim 1, wherein the conductive material is copper.

4. The method of claim 1, further comprising the step of: ensuring that the layer of oxide material is thick enough such that topographical variations after the chemical mechanical polishing process and the removal of the liner are entirely within the layer of oxide material of the hard mask.

5. The method of claim 1, wherein the layer of oxide material has a thickness in the range of 50-5000 Å.

6. The method of claim 1, wherein the layer of silicon carbide material has a thickness in the range of 50-5000 Å.

7. The method of claim 1, wherein the touch-up polishing process comprises using an abrasive-free or low-abrasive polish to obtain a very high selectivity between the conductive material and the silicon carbide material of the hard mask.

* * * * *